United States Patent
Yue et al.

(10) Patent No.: US 12,374,568 B2
(45) Date of Patent: Jul. 29, 2025

(54) ONE CHAMBER MULTI-STATION SELECTIVE METAL REMOVAL

(71) Applicant: Applied Materials, Inc., Santa Clara, CA (US)

(72) Inventors: Shiyu Yue, Santa Clara, CA (US); Sahil Jaykumar Patel, Sunnyvale, CA (US); Yu Lei, Belmont, CA (US); Wei Lei, Santa Clara, CA (US); Chih-Hsun Hsu, Santa Clara, CA (US); Yi Xu, San Jose, CA (US); Abulaiti Hairisha, Santa Clara, CA (US); Cong Trinh, Santa Clara, CA (US); Yixiong Yang, San Jose, CA (US); Ju Hyun Oh, San Jose, CA (US); Aixi Zhang, Santa Clara, CA (US); Xingyao Gao, San Jose, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 224 days.

(21) Appl. No.: 18/458,146

(22) Filed: Aug. 29, 2023

(65) Prior Publication Data
US 2025/0079199 A1 Mar. 6, 2025

(51) Int. Cl.
| | | |
|---|---|---|
| H01L 21/67 | (2006.01) | |
| H01J 37/32 | (2006.01) | |
| H01L 21/3213 | (2006.01) | |

(52) U.S. Cl.
CPC .. *H01L 21/67069* (2013.01); *H01J 37/32816* (2013.01); *H01J 37/32899* (2013.01);
(Continued)

(58) Field of Classification Search
None
See application file for complete search history.

(56) References Cited

U.S. PATENT DOCUMENTS

2016/0079073 A1* 3/2016 Matsui ............ H01L 21/30621
438/694
2017/0130330 A1* 5/2017 Nardi ............... C23C 16/45534
(Continued)

FOREIGN PATENT DOCUMENTS

WO 2021178399 A1 9/2021

OTHER PUBLICATIONS

International Search Report and Written Opinion dated Sep. 24, 2024 for Application No. PCT/US2024/032033.

*Primary Examiner* — Binh X Tran
(74) *Attorney, Agent, or Firm* — Patterson + Sheridan, LLP

(57) ABSTRACT

A method of selective metal removal via gradient oxidation for a gap-fill includes performing process cycles, each process cycle including placing a wafer having a semiconductor structure thereon into a first processing station, the semiconductor structure including a dielectric layer patterned with a feature formed therein and a seed layer formed on sidewalls and a bottom surface of the feature and a top surface of the dielectric layer, performing a reduction process on the wafer in the first processing station, performing a gradient oxidation process on the wafer in the second processing station, performing a gradient etch process on the wafer in the third processing station, and performing the gradient etch process on the wafer in the fourth processing station, wherein the first, second, third, and fourth processing stations are located in an interior volume of a processing chamber.

20 Claims, 10 Drawing Sheets

(52) U.S. Cl.
CPC .. *H01L 21/32136* (2013.01); *H01L 21/32138* (2013.01); *H01J 2237/2001* (2013.01); *H01J 2237/335* (2013.01); *H01J 2237/338* (2013.01)

(56) References Cited

U.S. PATENT DOCUMENTS

| | | | |
|---|---|---|---|
| 2019/0035640 A1 | 1/2019 | Thorkelsson et al. | |
| 2019/0131167 A1* | 5/2019 | Rice | H01L 21/67248 |
| 2019/0352776 A1* | 11/2019 | Parikh | H01L 21/76885 |
| 2020/0090978 A1 | 3/2020 | AuBuchon et al. | |
| 2021/0305059 A1 | 9/2021 | Lai et al. | |
| 2021/0320034 A1* | 10/2021 | Lei | H01L 21/2855 |
| 2021/0351032 A1* | 11/2021 | Cen | H01L 21/02063 |
| 2023/0343643 A1 | 10/2023 | Hsu et al. | |
| 2023/0343644 A1 | 10/2023 | Hsu et al. | |
| 2023/0343645 A1* | 10/2023 | Wu | H01L 21/76876 |
| 2023/0420295 A1* | 12/2023 | Yang | H01L 21/76856 |

* cited by examiner

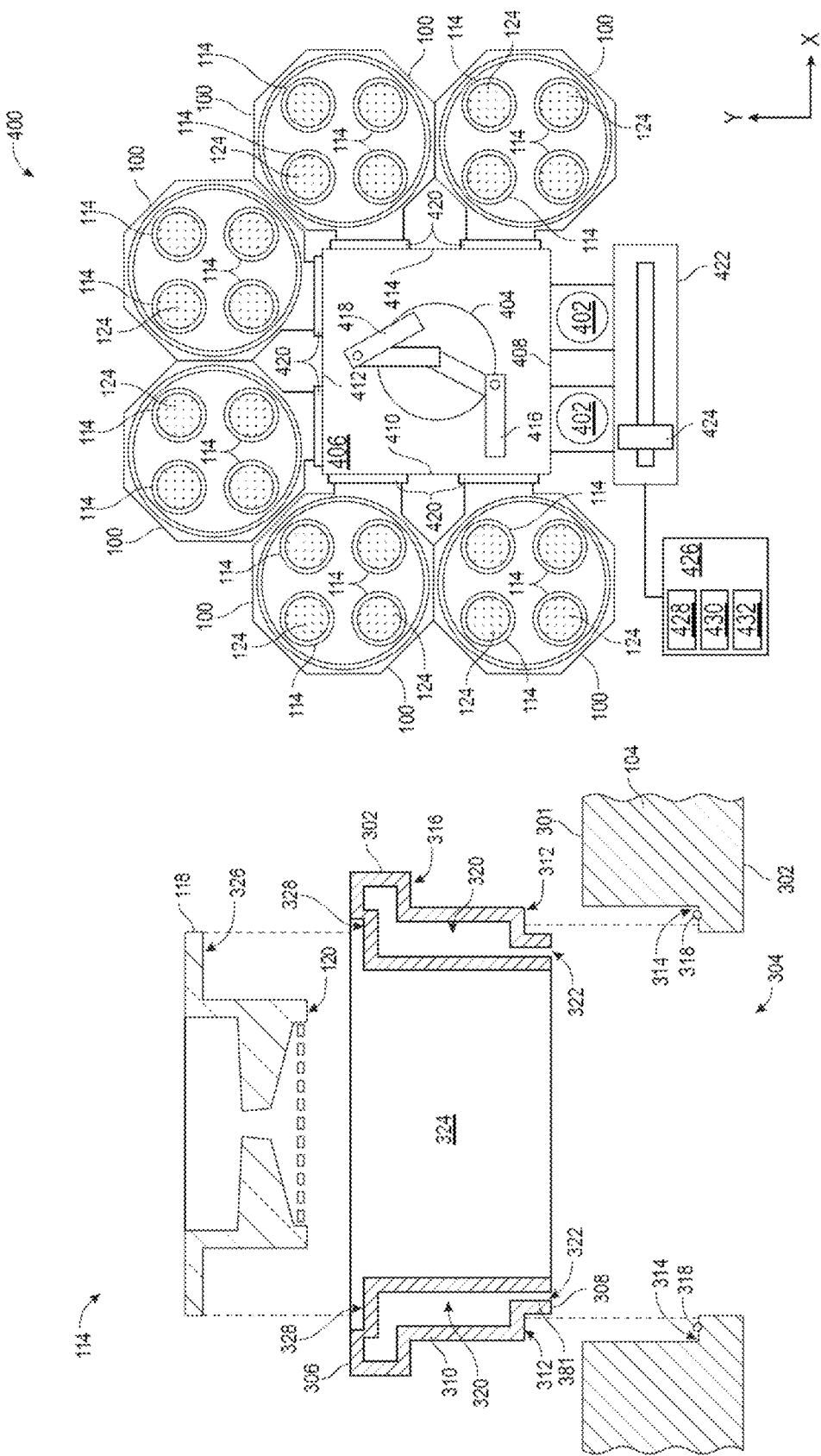

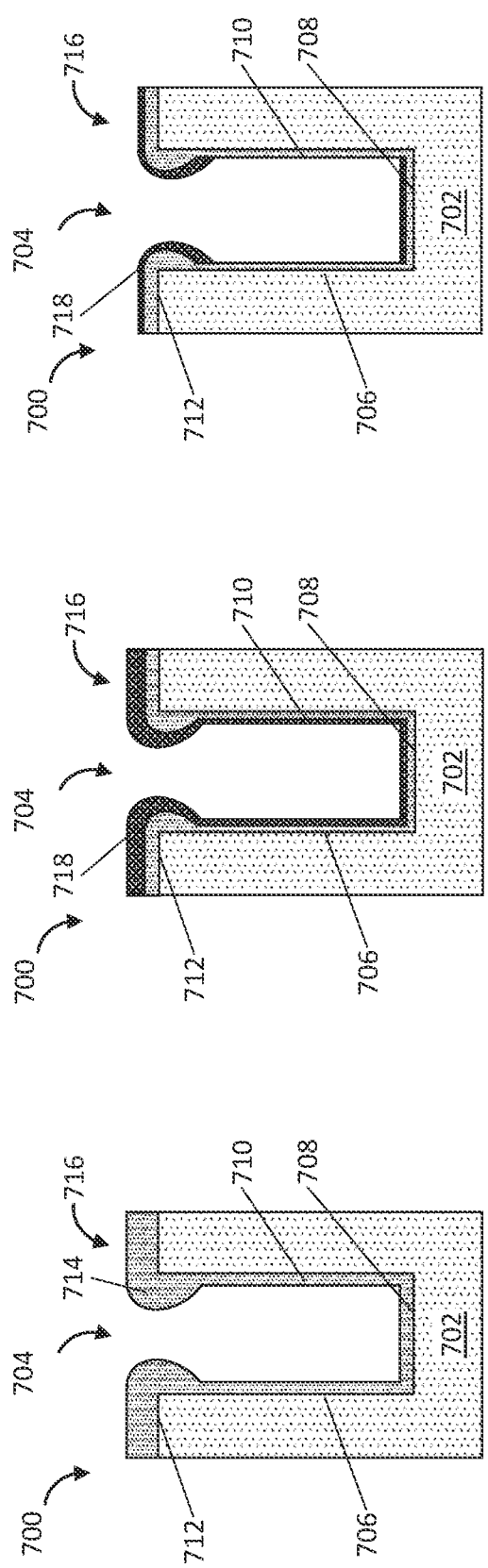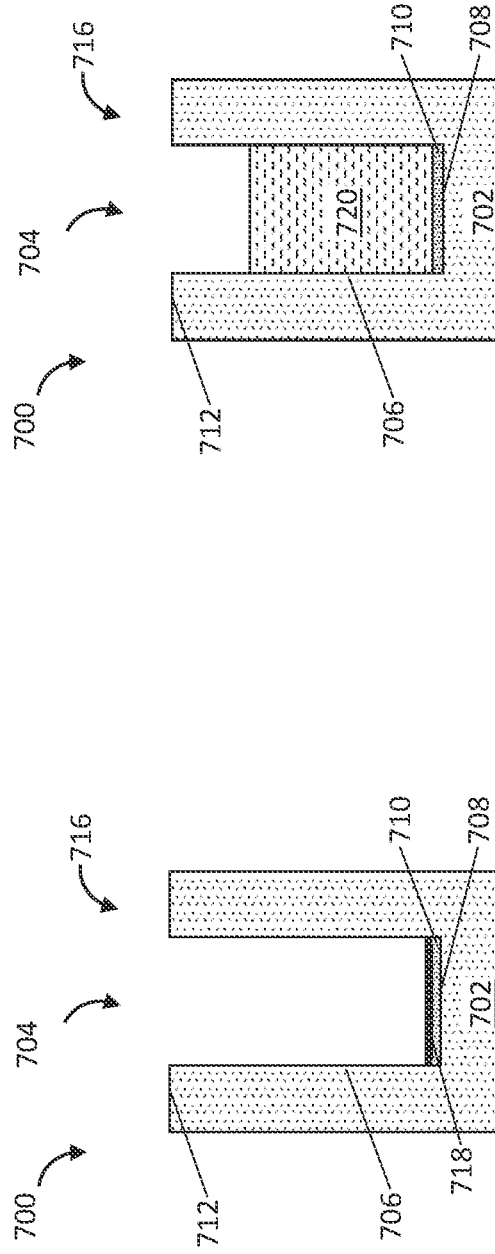

ONE CHAMBER MULTI-STATION SELECTIVE METAL REMOVAL

BACKGROUND

Field

Embodiments described herein generally relate to a method and apparatus of forming thin films, and more particularly, to a method and apparatus of selective metal removal via gradient oxidation for a gap-fill.

Description of the Related Art

The fabrication of microelectronic devices typically involves a complicated process sequence requiring hundreds of individual steps performed on semi-conductive, dielectric and conductive substrates. Examples of these process steps include oxidation, diffusion, ion implantation, thin film deposition, cleaning, etching, and lithography among other operations. Each operation is time consuming and expensive.

With ever-decreasing critical dimensions for the microelectronic devices, the design and fabrication for these devices on substrates becomes increasingly complex. Control of the critical dimensions and process uniformity becomes increasingly more important. Complex multilayer stacks require precise process monitoring of the critical dimensions for the thickness, roughness, stress, density, and potential defects. Multiple incremental steps in the process recipes for forming the devices ensure critical dimensions are maintained. However, each recipe step may utilize one or more processing chambers that adds additional time for forming the devices in the processing systems and also provides additional opportunities for forming defects. Thus, each step adds to the overall fabrication cost for the completed microelectronic devices.

Additionally, as critical dimensions on these devices shrink, past fabrication techniques encounter new hurdles. For example, as a seed layer is prepared to grow a metal gap fill, the seed layer may be still be present on the sides of the gap causing the fill material to close off the gap prior to completely filling at the bottom. Conventional methods for removing the seed layer from the sides of the gap and the top surface may additionally result in the removal of the seed layer at the bottom of the gap intended for seeding the fill material.

Therefore, there is an ongoing need for improved fabrication methods to minimize cost while maintaining critical dimensions for microelectronic devices.

SUMMARY

Embodiments of the present disclosure provide a method of selective metal removal via gradient oxidation for a gap-fill. The method includes performing process cycles, each process cycle including placing a first wafer having a first semiconductor structure thereon into a first processing station, the first semiconductor structure including a dielectric layer patterned with a feature formed therein and a seed layer formed on sidewalls and a bottom surface of the feature and a top surface of the dielectric layer, performing a reduction process on the first wafer in the first processing station, reducing oxides from the seed layer on the bottom surface of the feature, transferring the first wafer to a second processing station, performing a gradient oxidation process on the first wafer in the second processing station, partially oxidizing the seed layer in a field region over the top surface of the dielectric layer, transferring the first wafer to a third processing station, performing a gradient etch process on the first wafer in the third processing station, removing the oxidized seed layer, transferring the first wafer to a fourth processing station, and performing the gradient etch process on the first wafer in the fourth processing station, wherein the first, second, third, and fourth processing stations are located in an interior volume of a processing chamber.

Embodiments of the present disclosure also provide a method of selective metal removal via gradient oxidation for a gap-fill. The method includes performing process cycles, each process cycle including placing a first wafer having a first semiconductor structure thereon into a first processing station, a second wafer having a second semiconductor structure thereon into a second processing station, a third wafer having a third semiconductor structure thereon into a third processing station, and a fourth wafer having a fourth semiconductor structure thereon into a fourth processing station, each of the first, second, third, and fourth semiconductor structures including a dielectric layer patterned with a feature formed therein and a seed layer formed on sidewalls and a bottom surface of the feature and a top surface of the dielectric layer, performing a reduction process on the first wafer in the first processing station and on the third wafer in the third processing station, reducing oxides from the seed layer on the bottom surface of the feature, performing a gradient oxidation process on the first wafer in the first processing station and on the third wafer in the third processing station, partially oxidizing the seed layer in a field region over the top surface of the dielectric layer, transferring the first wafer into the second processing station, the second wafer into the third processing station, the third wafer into the fourth processing station, and the fourth wafer into the first processing station, performing a gradient etch process on the first wafer in the second processing station and on the third wafer in the fourth processing station, removing the oxidized seed layer, and the reduction process on the second wafer in the third processing station and on the fourth wafer in the first processing station, and performing the gradient etch process on the first wafer in the second processing station and on the third wafer in the fourth processing station, and the gradient oxidation process on the second wafer in the third processing station and on the fourth wafer in the first processing station, wherein the first, second, third, and fourth processing stations are located in an interior volume of a processing chamber.

Embodiments of the present disclosure further provide a processing platform. The processing platform includes a processing chamber comprising a first processing station, a second processing station, a third processing station, a fourth processing station, located in an interior volume of the processing chamber, and a controller configured to cause the processing platform to perform process cycles, etch cycle including placing a first wafer having a first semiconductor structure thereon into the first processing station, the first semiconductor structure comprising a dielectric layer patterned with a feature formed therein and a seed layer formed on sidewalls and a bottom surface of the feature and a top surface of the dielectric layer, performing a reduction process on the first wafer in the first processing station, reducing oxides from the seed layer on the bottom surface of the feature, transferring the first wafer to the second processing station, performing a gradient oxidation process on the first wafer in the second processing station, partially oxidizing the seed layer in a field region over the top surface of the dielectric layer, transferring the first wafer to the third processing station, performing a gradient etch process on the first wafer in the third processing station, removing the oxidized seed layer, transferring the first wafer to the fourth processing station, and performing the gradient etch process on the first wafer in the fourth processing station.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIG. 3 is an exploded cross-sectional view of a processing station in accordance with one or more embodiment of the disclosure.

FIG. 4 is a schematic representation of a processing platform in accordance with one or more embodiment of the disclosure.

FIGS. 7A, 7B, 7C, 7D, and 7E are cross-sectional views of a portion of a semiconductor structure, corresponding to various states of the method of FIG. 6.

Figure 1:
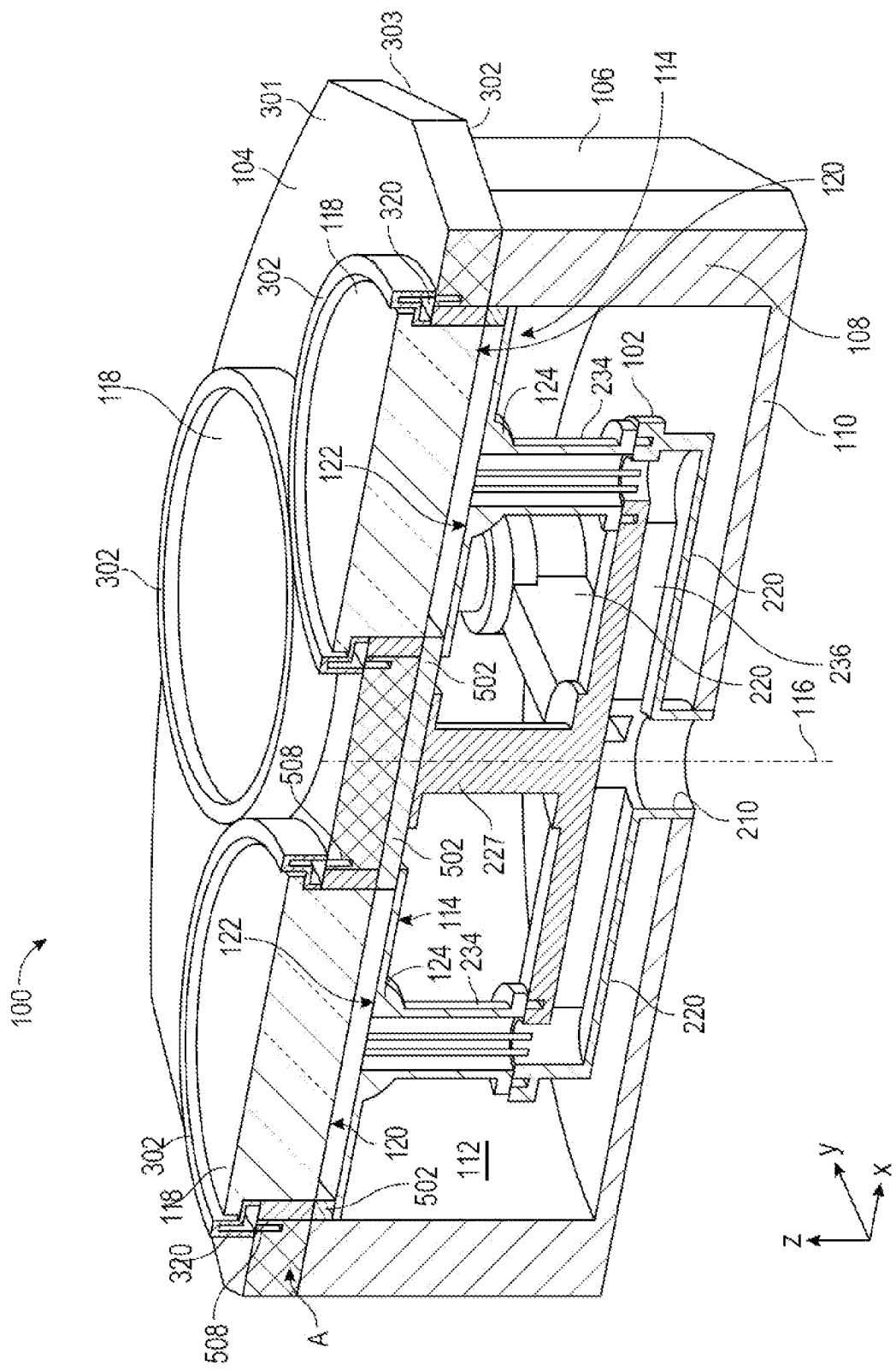
FIG. 1 shows a cross-sectional isometric view of a processing chamber in accordance with one or more embodiment of the disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide methods and apparatuses for integrated processes of a reduction process, a gradient metal oxidation process, and a chemical metal oxide etch process within the same processing chamber having multiple process stations. The reduction process uses a hydrogen ($H_2$) plasma to reset a metal surface, the gradient metal oxidation process uses an oxygen ($O_2$) plasma to partially oxidize the metal, and the chemical metal etch process selectively removes the oxidized metal. The processing chamber described herein enables multi-cycling capability with high wafer throughput benefits.

The methods described herein fully utilize the advantage of a processing chamber with multiple processing stations inside an internal volume of the processing chamber. With the use of the in-situ hydrogen ($H_2$) plasma-oxygen ($O_2$)-chemical metal oxide etch flow, throughput will be increased significantly as compared with the same process performed in multiple processing chambers. A movement between processing stations ban be minimized to less than 1 seconds.

Figure 2:
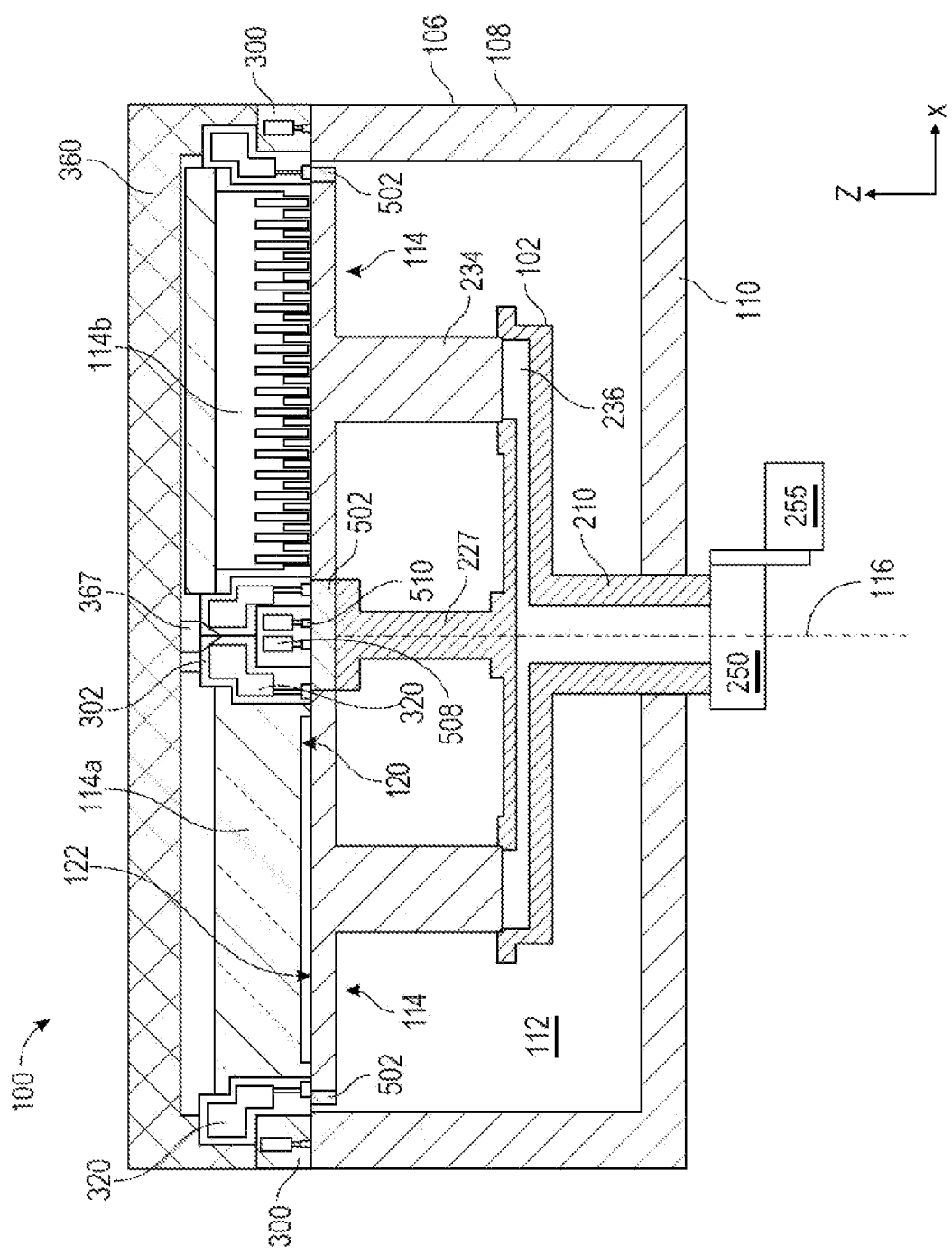
FIG. 2 shows a cross-sectional view of a processing chamber in accordance with one or more embodiment of the disclosure.

FIGS. 1 and 2 illustrate a processing chamber 100 having multiple processing stations, in accordance with one or more embodiment of the disclosure. FIG. 1 shows the processing chamber 100 illustrated as a cross-sectional isometric view in accordance with one or more embodiment of the disclosure. FIG. 2 shows the processing chamber 100 in cross-section according to one or more embodiment of the disclosure. Accordingly, some embodiments of the disclosure are directed to a processing chamber 100 that incorporates a heater support assembly 102 and a top plate 104.

The processing chamber 100 has a housing 106 with walls 108 and a bottom 110. The housing 106 along with the top plate 104 define an interior volume 112.

The processing chamber 100 includes a plurality of processing stations 114. The processing stations 114 are spatially separated in the interior volume 112 of the housing 106 and are positioned in a circular arrangement around a rotational axis 116 of the heater support assembly 102. Each processing station 114 independently has a processing chamber temperature that can be different from the other processing station temperatures. Each processing station 114 includes a gas injector 118 having a front face 120. In some embodiments, the front faces 120 of each of the gas injectors 118 are substantially coplanar. The processing stations 114 are defined as a region in which processing can occur. For example, a processing station 114 can be defined by a substrate support surface 122 of heaters 124, and the front face 120 of the gas injectors 118.

The processing stations 114 can be configured to perform any suitable process and provide any suitable process conditions. The type of gas injector 118 used will depend on, for example, the type of process being performed and the type of showerhead or gas injector. For example, a processing station 114 configured to operate as an atomic layer deposition apparatus may have a showerhead or vortex type gas injector. Whereas, a processing station 114 configured to operate as a plasma station may have one or more electrode and/or grounded plate configuration to generate a plasma while allowing a plasma gas to flow toward the wafer. The embodiment illustrated in FIG. 2 has a different type of processing station 114 on the left side (processing station 114a) of the drawing from on the right side (processing station 114b) of the drawing. Suitable processing stations 114 include, but are not limited to, an inductively coupled plasma (ICP) process station, a capacitively coupled plasma (CCP) process station, an etch soak process station, a thermal process station, a microwave plasma station, a UV exposure station, a laser process station, a pumping chamber station, an annealing station, and a metrology station.

In one or more embodiments, the substrate support surfaces include heaters 124 which can support a wafer. In some embodiments, the substrate support surfaces or heaters 124 includes electrostatic chucks.

FIG. 3 illustrates an exploded view of the processing station 114 in accordance with one or more embodiment of the disclosure. The processing station 114 illustrated includes three main components: the top plate 104, a pump/purge insert 302 and the gas injector 118. The gas injector 118 shown in FIG. 3 is a showerhead type gas injector. In some embodiments, the pump/purge insert 302 is connected to or in fluid communication with a vacuum (exhaust). In some embodiments, the pump/purge insert 302 is connected to or in fluid communication with a purge gas source (not shown).

Openings 304 in the top plate 104 can be uniformly sized or have different sizes. Different sized/shape gas injectors 118 can be used with a pump/purge insert 302 that is suitably shaped to transition from the opening 304 to the gas injector 118. For example, as illustrated, the pump/purge insert 302 includes a top 306 and a bottom 308 with a sidewall 310. When inserted into the opening 304 in the top plate 104, a ledge 312 adjacent the bottom 308 can be positioned on a shelf 314 formed in the opening 304. In some embodiments, there is no shelf 314 in the opening and a flange portion 316 of the pump/purge insert 302 rests on top of the top plate 104. In the illustrated embodiment, the ledge 312 rests on the shelf 314 with an O-ring 318 positioned between to help form a gas-tight seal.

In some embodiments, there are one or more purge rings (not shown) in the top plate 104. The purge rings can be in fluid communication with a purge gas plenum (not shown) or a purge gas source (not shown) to provide a positive flow of purge gas to prevent leakage of processing gases from the processing chamber.

The pump/purge insert 302 of some embodiments includes a gas plenum 320 with at least one opening 322 in the bottom 308 of the pump/purge insert 302. The gas plenum 320 has an inlet (not shown), typically near the top 306 or the sidewall 310 of the pump/purge insert 302.

In some embodiments, the plenum 320 can be charged with a purge or inert gas which can pass through the opening 322 in the bottom 308 of the pump/purge insert 302. The gas flow through the opening 322 can help create a gas curtain type barrier to prevent leakage of process gases from the interior of the processing chamber.

In some embodiments, the plenum 320 is connected to or in fluid communication with a vacuum source. In such an embodiment, gases flow through the opening 322 in the bottom 308 of the pump/purge insert 302 into the plenum 320. The gases can be evacuated from the plenum to exhaust. Such arrange can be used to evacuate gases from the processing station 114 during use.

The pump/purge insert 302 includes an opening 324 in which a gas injector 118 can be inserted. The gas injector 118 illustrated has a flange 326 which can be in contact with a ledge 328 adjacent the top 306 of the pump/purge insert 302. The diameter or width of the gas injector 118 can be any suitable size that can fit within the opening 324 of the pump/purge insert 302. This allows gas injectors 118 of various types to be used within the same opening 304 in the top plate 104.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different number of one or more of the processing chambers 100, buffer stations 402 and/or robot 404 configurations than the illustrated embodiment.

The exemplary processing platform 400 includes a central transfer station 406 which has a plurality of sides 408, 410, 412, 414. The central transfer station 406 shown has a first side 408, a second side 410, a third side 412 and a fourth side 414. Although four sides are shown, those skilled in the art will understand that there can be any suitable number of sides to the central transfer station 406 depending on, for example, the overall configuration of the processing platform 400. In some embodiments, the transfer station 406 has three sides, four sides, five sides, six sides, seven sides or eight sides.

The transfer station 406 has a robot 404 positioned therein. The robot 404 can be any suitable robot capable of moving a wafer during processing. In some embodiments, the robot 404 has a first arm 416 and a second arm 418. The first arm 416 and the second arm 418 can be moved independently of the other arm. The first arm 416 and the second arm 418 can move in the X-Y plane and/or along the Z-axis. In some embodiments, the robot 404 includes a third arm (not shown) or a fourth arm (not shown). Each of the arms can move independently of other arms.

The embodiment illustrated includes six processing chambers 100 with two connected to each of the second side 410, third side 412, and fourth side 414 of the central transfer station 406. Each of the processing chambers 100 can be configured to perform different processes.

The processing platform 400 can also include one or more buffer station 402 connected to the first side 408 of the central transfer station 406. The buffer stations 402 can perform the same or different functions. For example, the buffer stations 402 may hold a cassette of wafers which are processed and returned to the original cassette, or one of the buffer stations 402 may hold unprocessed wafers which are moved to the other buffer station 402 after processing. In some embodiments, one or more of the buffer stations 402 are configured to pre-treat, pre-heat or clean the wafers before and/or after processing.

The processing platform 400 may also include one or more slit valves 420 between the central transfer station 406 and any of the processing chambers 100. The slit valves 420 can open and close to isolate the interior volume 112 within the processing chamber 100 from the environment within the central transfer station 406. For example, if the processing chamber 100 generates plasma during processing, it may be helpful to close the slit valve 420 for that processing chamber 100 to prevent stray plasma from damaging the robot 404 in the central transfer station 406.

The processing platform 400 can be connected to a factory interface 422 to allow wafers or cassettes of wafers to be loaded into the processing platform 400. A robot 424 within the factory interface 422 can be used to move the wafers or cassettes into and out of the buffer stations. The wafers or cassettes can be moved within the processing platform 400 by the robot 404 in the central transfer station 406. In some embodiments, the factory interface 422 is a transfer station 406 of another cluster tool (i.e., another multiple chamber processing platform).

A controller 426 may be provided and coupled to various components of the processing platform 400 to control the operation thereof. The controller 426 can be a single controller that controls the entire processing platform 400, or multiple controllers that control individual portions of the processing platform 400. For example, the processing platform 400 may include separate controllers for each of the individual processing chambers 100, central transfer station 406, factory interface 422 and robots 404.

In some embodiments, the controller 426 includes a central processing unit (CPU) 428, a memory 430, and support circuits 432. The controller 426 may control the processing platform 400 directly, or via computers (or controllers) associated with particular process chamber and/or support system components.

The controller 426 may be one of any form of general-purpose computer processor that can be used in an industrial setting for controlling various chambers and sub-processors. The memory 430 or computer readable medium of the controller 426 may be one or more of readily available memory such as random access memory (RAM), read only memory (ROM), floppy disk, hard disk, optical storage media (e.g., compact disc or digital video disc), flash drive, or any other form of digital storage, local or remote. The memory 430 can retain an instruction set that is operable by the processor (CPU 428) to control parameters and components of the processing platform 400.

The support circuits 432 are coupled to the CPU 428 for supporting the processor in a conventional manner. These circuits include cache, power supplies, clock circuits, input/output circuitry and subsystems, and the like. One or more processes may be stored in the memory 430 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 428.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 426 has one or more configurations to execute individual processes or sub-processes to perform the method. The controller 426 can be connected to and configured to operate intermediate components to perform the functions of the methods. For example, the controller 426 can be connected to and configured to control one or more of gas valves, actuators, motors, slit valves, vacuum control or other components.

Figure 5A:
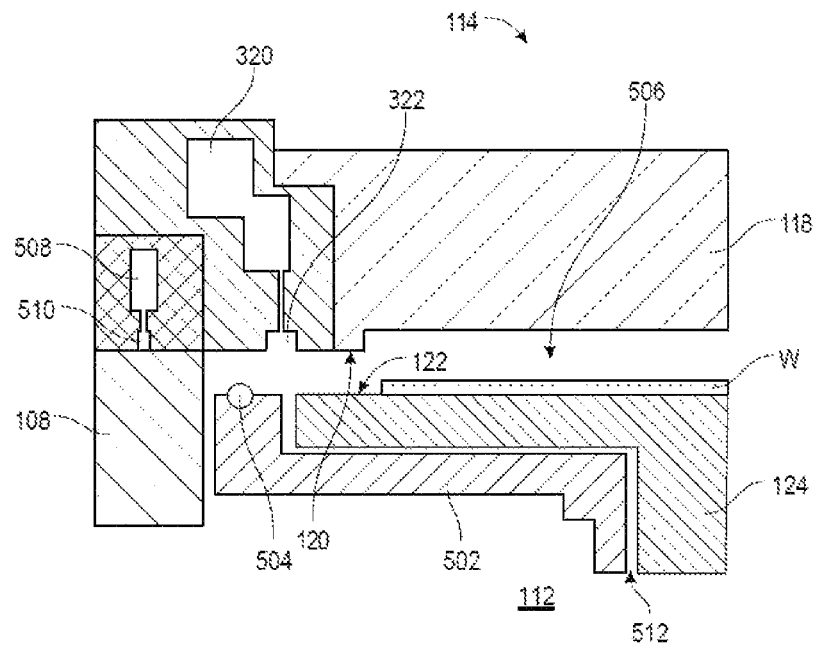
FIGS. 5A and 5B show schematic representations of a process in accordance with one or more embodiment of the disclosure.
Figure 5B:
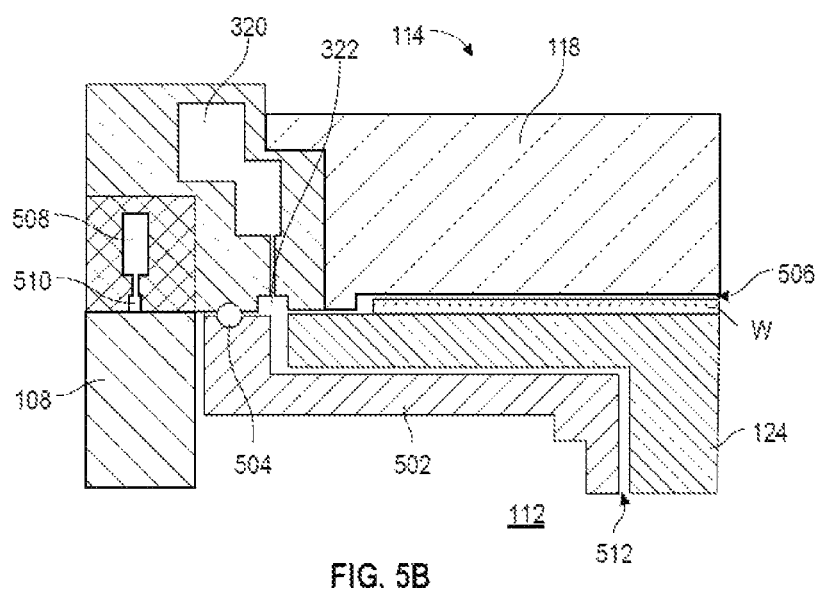

FIGS. 5A and 5B illustrate another embodiment of the disclosure. FIG. 5A shows a partial view of a heater 124 and a support plate 502 which has been rotated to a position beneath processing station 114 so that a wafer W is adjacent the gas injector 118. An O-ring 504 on the support plate 502, or on an outer portion of the heater 124, is in a relaxed state.

FIG. 5B shows the support plate 502 and heater 124 after being moved toward the processing station 114 so that the substrate support surface 122 of the heater 124 is in contact with or nearly contacts the front face 120 of the gas injector 118 in the processing station 114. In this position, the O-ring 504 is compressed forming a seal around the outer edge of the support plate 502 or outer portion of the heater 124. This allows the wafer W to be moved as close the gas injector 118 as possible to minimize the volume of a reaction region 506 so that the reaction region 506 can be rapidly purged.

Gases which might flow out of the reaction region 506 are evacuated through the opening 322 into the plenum 320 and to an exhaust or foreline (not shown). A purge gas curtain outside of the opening 322 can be generated by a purge gas plenum 508 and a purge gas port 510. Additionally, a gap 512 between the heater 124 and the support plate 502 can help to further curtain off the reaction region 506 and a purging gas flow through the gap 512 prevent a gas back flow of reactive gases from flowing into the interior volume 112 of the processing chamber 100.

Figure 6:
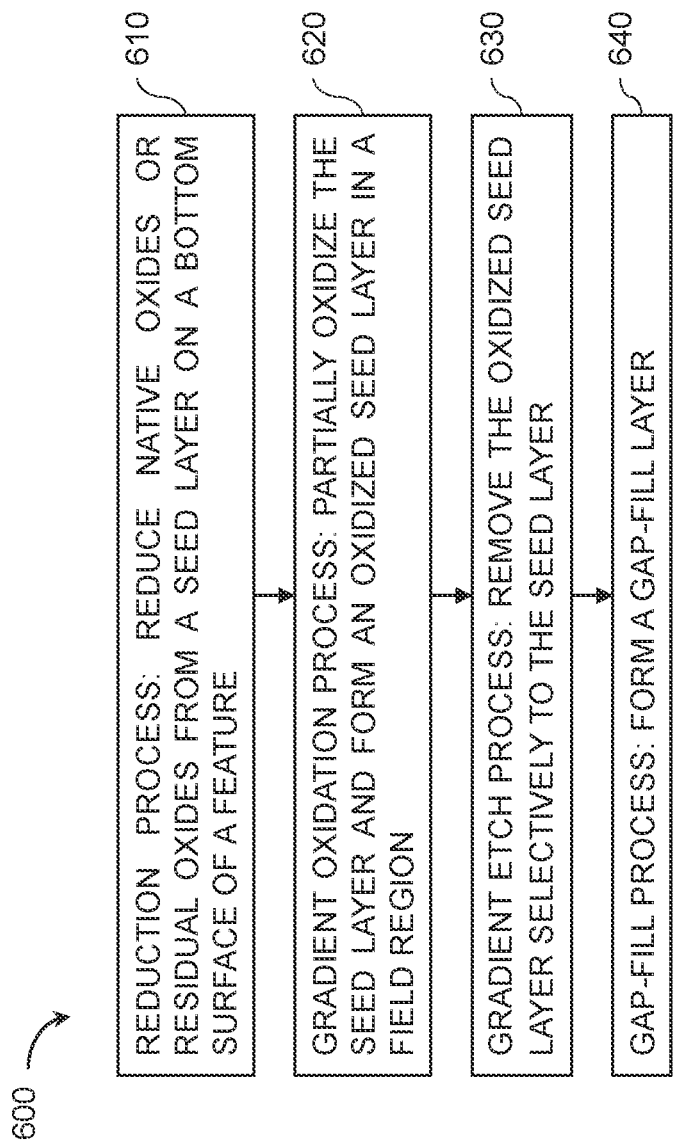
FIG. 6 depicts a process flow diagram of a method of selective metal removal via gradient oxidation for a gap-fill, according to one or more embodiments of the present disclosure.

FIG. 6 depicts a process flow diagram of a method 600 of selective metal removal via gradient oxidation for a gap-fill, according to one or more embodiments of the present disclosure. FIGS. 7A, 7B, 7C, 7D, and 7E are cross-sectional views of a portion of a semiconductor structure 700, corresponding to various states of the method 600. It should be understood that FIGS. 7A, 7B, 7C, 7D, and 7E illustrate only partial schematic views of the semiconductor structure 700, and the semiconductor structure 700 may contain any number of transistor sections and additional materials having aspects as illustrated in the figures. It should also be noted that although the method illustrated in FIG. 6 is described sequentially, other process sequences that include one or more operations that have been omitted and/or added, and/or has been rearranged in another desirable order, fall within the scope of the embodiments of the disclosure provided herein.

As shown in FIG. 7A, the semiconductor structure 700 includes a dielectric layer 702 formed on a substrate (also referred to as a "wafer," not shown). The dielectric layer 702 is patterned with one or more features 704, such as a trench, a via, a hole, or combinations thereof. The feature 704 includes sidewalls 706 and a bottom surface 708 extending between the sidewalls 706. A liner (not shown) may be formed on the sidewalls 706 and the bottom surface 708 of the feature 704. A seed layer 710 is formed over the sidewalls 706 and the bottom surface 708 of the feature and on a top surface 712 of the dielectric layer 702. The seed layer 710 may create an overhang portion 714 in a field region 716 above the top surface 712 of the dielectric layer 702, which obstructs or blocks top openings of the feature 704.

The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

The dielectric layer 702 may be formed of silicon oxide ($SiO_2$), silicon oxynitride ($SiO_xN_y$), silicon nitride ($Si_3N_4$), or a combination thereof. The dielectric layer 702 may be formed by a physical vapor deposition (PVD) process, an atomic layer deposition (ALD) process, an epitaxial (Epi) deposition process, or other suitable deposition process.

The feature 704 may have a depth as measured from the field region 716 to the bottom surface 708 of between about 2 nm and about 200 nm, between about 3 nm and about 200 nm, between about 5 nm and about 100 nm, between about 2 nm and about 100 nm, or between about 50 nm and about 100 nm, and a width between the sidewalls 706 of between about 10 nm and about 100 nm, between about 10 nm and about 20 nm, between about 10 nm and about 50 nm, or between about 50 nm and about 100 nm. In some embodiments, the feature 704 has an aspect ratio (depth/width) of between about 1 and about 20, between about 5 and about 20, between about 10 and about 20, or between about 15 and about 20.

In some embodiments, the feature 704 extends from the field region 716 downwards into the substrate.

The liner layer may be formed of titanium silicon, titanium silicon nitride, titanium nitride (TiN), tantalum nitride (TaN), tungsten (W), molybdenum (Mo), or other suitable material, having a thickness of between about 1 Å and about 100 Å, for example, between about 20 Å and about 50 Å. The liner layer may be formed by a physical vapor deposition (PVD) process, an atomic layer deposition (ALD) process, an epitaxial (Epi) deposition process, or other suitable deposition process.

The seed layer 710 may be formed of a metal material suitable to function as a seed layer for subsequent deposition of a metal gap-fill material, such as a tungsten (W) or tungsten-containing layer, a molybdenum (Mo) or molybdenum-containing layer, or a ruthenium (Ru) or ruthenium-containing layer. The seed layer 710 may be formed by a physical vapor deposition (PVD) process, a low temperature and low-pressure CVD process, or other suitable deposition process.

The method 600 begins with block 610, in which a reduction process is performed to reduce native oxides or residual oxides (e.g., tungsten oxide ($WO_x$)) from the seed layer 710 on the bottom surface 708 of the feature 704. The reduction process includes exposing the surface of the seed layer 710 to a plasma formed from process gas including hydrogen ($H_2$)-containing gas, ammonia ($NH_3$)-containing gas, or carbon oxide (CO)-containing gas. The reduction process may be an inductively coupled plasma (ICP) process, a capacitively coupled plasma (CCP) process, or remote plasma process, performed in a processing station, such as one of the processing stations 114 shown in FIG. 1.

In some embodiments, during the reduction process, the processing station is maintained at a pressure of between 2 mTorr and about 120 mTorr, such as between about 50 mTorr and about 110 m Torr, between about 60 m Torr and about 100 m Torr, or between about 70 mTorr and about 90 mTorr. During the reduction process, the semiconductor structure 700 may be maintained at a temperature of about 450° C. or less, such as between about 200° C. and about 450° C., between about 250° C. and about 400° C., or between about 300° C. and about 350° C. During the reduction process, ICP plasma power of 2000 Watts or less, such as between about 500 Watts and 1500 Watts, or for example, between about 850 Watts and about 1000 Watts, is applied to maintain the plasma. The reduction process may be performed for a time duration of 90 seconds or less, such as between about 10 seconds and about 40 seconds, or between about 10 seconds and about 30 seconds.

In block 620, a gradient oxidation process is performed to partially oxidize the seed layer 710 and form an oxidized seed layer 718 in the field region 716, as shown in FIG. 7B. The gradient oxidation process includes exposing the seed layer 710 to a plasma formed from process gas including at least one of oxygen ($O_2$), $H_2O$, and $H_2O_2$, or including hydrogen ($H_2$) and oxygen ($O_2$). The gradient oxidation process may be an inductively coupled plasma (ICP) process, a capacitively coupled plasma (CCP) process, or remote plasma process, performed in a processing station, such as one of the processing stations 114 shown in FIG. 1.

In some embodiments, the gradient oxidation process uses an oxygen ($O_2$) ICP that includes a limited gas flow to create an oxygen starvation reaction mode on exposed surfaces of the seed layer 710. The $O_2$ ICP provides a low power $O_2$ plasma with a high ion/radical ratio, which enhances oxidation of the seed layer 710 in the field region 716 and deactivates the reactive species before reaching the seed layer 710 over the bottom surface 708 of the feature 704. In this mode, the seed layer 710 in the field region 716 and the overhang portion 714 of the seed layer 710 are oxidized, or more heavily oxidized, than the seed layer 710 on the bottom surface 708 of the feature 704, which allow for preferential etching of the oxidized regions of the seed layer 710 (i.e., the oxidized seed layer 718), while maintaining the seed layer 710 on the bottom surface 708 of the feature 704.

In some embodiments, during the gradient oxidation process, the processing station is maintained at a pressure of less than about 10 mTorr, such as between about 1 mTorr and about 5 mTorr, or between about 1 mTorr and about 2 mTorr. During the gradient oxidation process, the semiconductor structure 700 may be maintained at a temperature of about 450° C. or less, such as between about 200° C. and about 450° C., between about 250° C. and about 400° C., or for example, between about 300° C. and about 350° C. During the oxidation process, ICP plasma power of 500 Watts or less, such as between about 100 Watts and 300 Watts, or between about 180 Watts and about 210 Watts. The oxidation process may be performed for a time duration of 60 seconds or less, such as between about 10 seconds and about 40 seconds, or between about 12 seconds and about 30 seconds.

In block 630, a gradient etch process is performed to remove the oxidized seed layer 718 selectively to the seed layer 710, as shown in FIG. 7C. The gradient etch process includes soaking the oxidized seed layer 718 and the seed layer 710 in a precursor including at least one of tungsten chloride ($WCl_5$, $WCl_6$), molybdenum fluoride ($MoF_6$), molybdenum chloride ($MoCl_5$, $MoCl_6$), tungsten fluoride ($WF_6$), tantalum chloride ($TaCl_5$), and tantalum fluoride ($TaF_5$), in a processing station, such as one of the processing stations 114 shown in FIG. 1.

In some embodiments, during the gradient etch process, the semiconductor structure 700 is maintained at a temperature of between 250° C. and 450° C.

The reduction process in block 610, the gradient oxidation process in block 620, and the gradient etch process in block 630 are repeated in a cycle in a processing chamber with multiple processing stations, such as the processing chamber 100 with multiple processing stations 114 shown in FIG. 4. The cycle is repeated R times, for example until the seed layer 710 is completely removed from the field region 716 and the sidewalls 706, as shown in FIG. 7D. In some embodiments, the number of the repetition R is between 2 and 10. The reduction process in block 610, the gradient oxidation process in block 620, and the gradient etch process in block 630 substantially inhibits the formation of seams and voids, present during conventional process, during the subsequent metal gap-fill by removing seed layer 710 from the field region 716 while maintaining seeding metal on the bottom surface 708 of the feature 704. Thus, a substantially seam-free metal gap-fill can be achieved.

In block 640, a gap-fill process is performed to form a gap-fill layer 720, as shown in FIG. 7E. The gap-fill process includes a chemical vapor deposition (CVD) deposition process, an atomic layer deposition (ALD) process, or other suitable deposition process. The gap-fill layer 720 may partially or completely fill the one or more features 704. The gap-fill layer 720 is formed of a metal such as tungsten (W), molybdenum (Mo), or ruthenium (Ru).

Figure 8A:
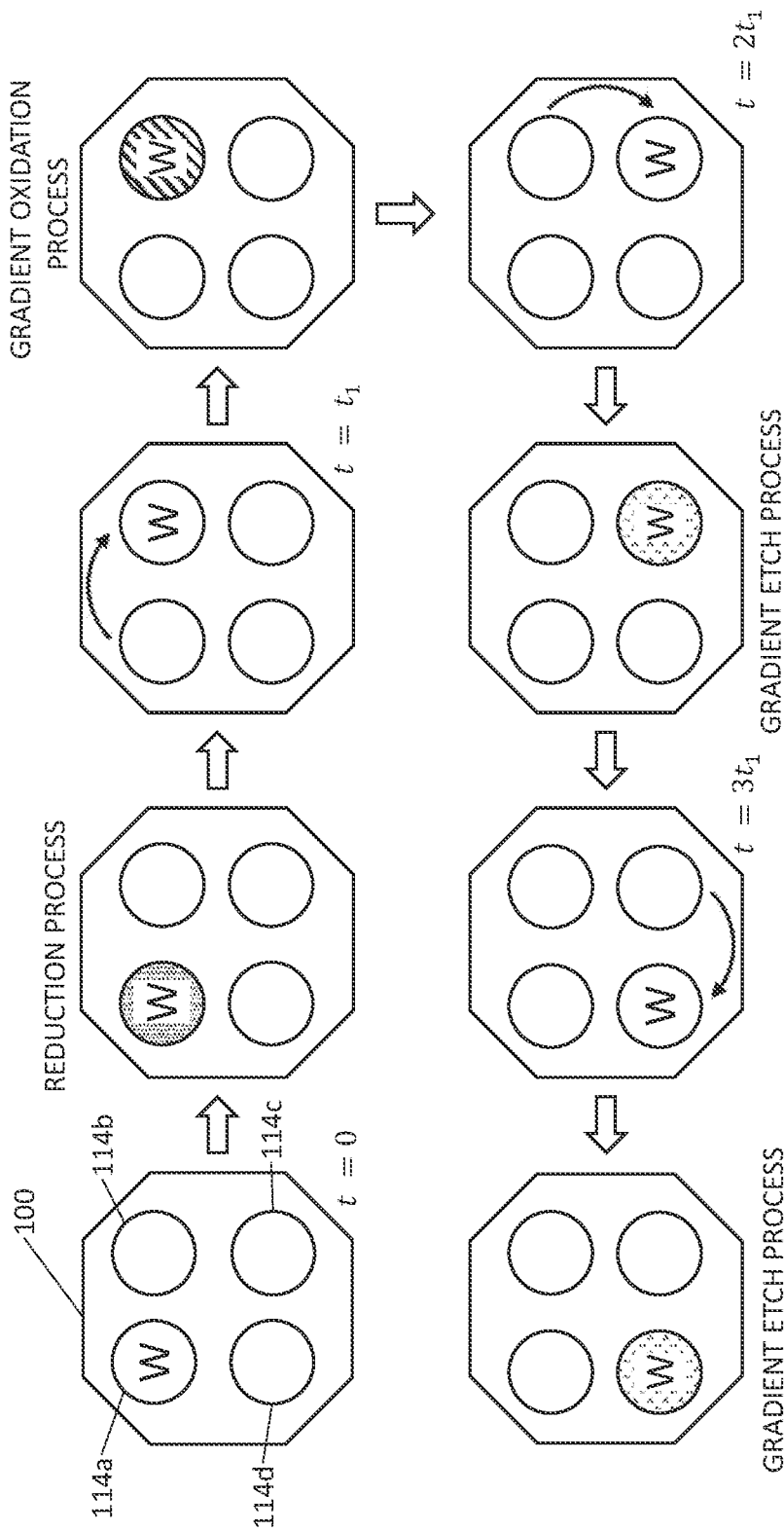
FIGS. 8A and 8B illustrate processing chamber configurations of a processing chamber with multiple processing stations, in accordance with one or more embodiment of the disclosure.
Figure 8B:
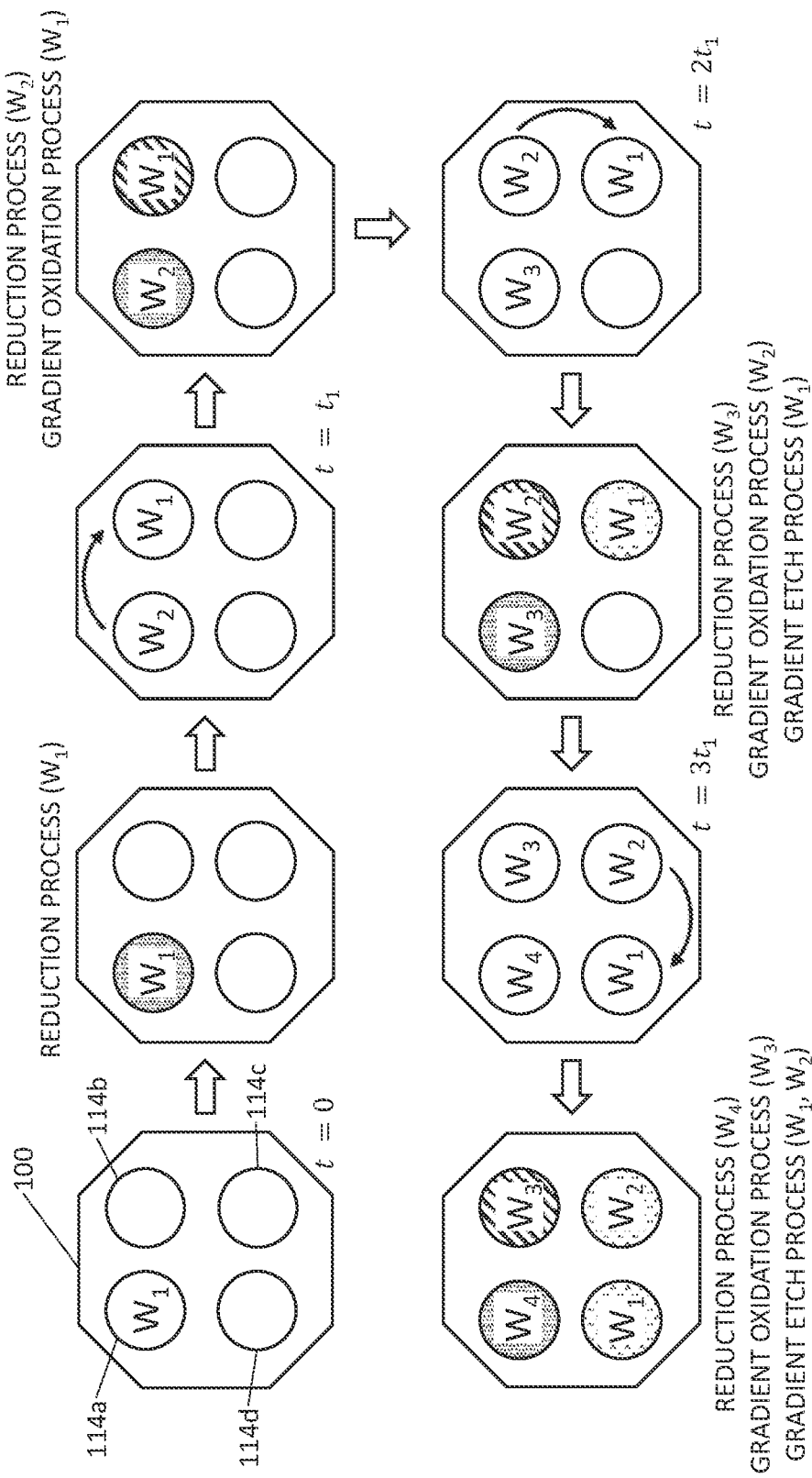

FIGS. 8A and 8B illustrate processing chamber configurations of a processing chamber with multiple processing stations, such as the processing chamber 100 having four processing stations 114, to perform process cycles of the reduction process in block 610, the gradient oxidation process in block 620, and the gradient etch process in block 630 of the method 600 in accordance with one or more embodiment of the disclosure. The four processing stations 114 aligned in the clockwise direction are labeled as 114a, 114b, 114c, and 114d. The processing station 114a is configured to perform the reduction process in block 610. The processing station 114b is configured to perform the gradient oxidation process in block 620. The processing stations 114c and 114d are configured to perform the gradient etch process in block 630.

A process cycle of the reduction process in block 610, the gradient oxidation process in block 620, and the gradient etch process in block 630 is repeated R times. The number of the repetition R is between 2 and 10.

As shown in FIG. 8A, in the r-th process cycle (r=1, 2, 3, . . . , R), a wafer W having a semiconductor structure 700 thereon on the heater support assembly 102 (shown in FIG. 2) is placed into the processing station 114a at time t=4(r−1)t$_1$ (t=0 in the first cycle as shown in FIG. 8A). Subsequently, the heater support assembly 102 is rotated such that the wafer W is transferred into the processing station 114b at time t=(4r−3)t$_1$ (t=t$_1$ in the first cycle as shown in FIG. 8A), to the processing station 114c at time t=(4r−2)t$_1$ (t=2t$_1$ in the first cycle as shown in FIG. 8A), to the processing station 114d at time t=(4r−1)t$_1$ (t=3t$_1$ in the first cycle as shown in FIG. 8A), and back to the processing station 114a at time t=4rt$_1$. At the final cycle (r=R), the wafer W is removed from the processing chamber 100.

In the r-th cycle, the reduction process in block 610 is performed in the processing station 114a for a time duration t$_1$ from time (4r−4)t$_1$ to (4r−3)t$_1$. The gradient oxidation process in block 620 is performed in the processing station 114b for a time duration t$_1$ from time (4r−3)t$_1$ to (4r−2)t$_1$. The gradient etch process in block 630 is performed in the processing station 114c for a time duration t$_1$ from time (4r−2)t$_1$ to (4r−1)t$_1$ and in the processing station 114d for a time duration t$_1$ from time (4r−1)t$_1$ to t=4rt$_1$, thus a total of a time duration 2t$_1$. The gradient etch process in block 630 is performed in the two processing stations 114c and 114d for the time duration t$_1$ each, to balance the combined gradient etch process time with the reduction process time (t$_1$) and the gradient oxidation process (t$_1$). The time duration t$_1$ is between about 10 seconds and about 90 seconds.

As shown in FIG. 8B, in this processing chamber configuration, multiple wafers up to four wafers W$_1$, W$_2$, W$_3$, and W$_4$ can be processed simultaneously.

At time t=0, a wafer W$_1$ having a semiconductor structure 700 thereon is placed in the processing station 114a. At time t=t$_1$, the heater support assembly 102 is rotated to place the wafer W$_1$ in the processing station 114b and a wafer W$_2$ having a semiconductor structure 700 thereon in the processing station 114a. At time t=2t$_1$, the heater support assembly 102 is rotated to place the wafer W$_1$ in the processing station 114c, the wafer W$_2$ in the processing station 114b, and a wafer W$_3$ having a semiconductor structure 700 thereon in the processing station 114a. At time t=3t$_1$, the heater support assembly 102 is rotated to place the wafer W$_1$ in the processing station 114d, the wafer W$_2$ in the processing station 114c, the wafer W$_3$ in the processing station 114b, and a wafer W$_4$ having a semiconductor structure 700 thereon in the processing station 114a.

Subsequently the heater support assembly 102 is rotated to transfer the wafer W$_1$ back to the processing station 114a, the wafer W$_2$ to the processing station 114d, the wafer W$_3$ to the processing station 114c, and the wafer W$_4$ to the processing station 114b at time t=(4r−4)t$_1$ in the r-th cycle (r=2, 3, 4, . . . ).

In the r-th cycle, from time (4r−4)t$_1$ to (4r−3)t$_1$ for a time duration t$_1$, the reduction process is performed on the wafer W$_1$ in the processing station 114a, the gradient oxidation process is performed on the wafer W$_4$ in the processing station 114b, if the reduction process has been performed on the on the wafer W$_4$, and the gradient etch process is performed on the wafer W$_3$ in the processing station 114c and the wafer W$_2$ in the processing station 114d, if the gradient etch process has been performed on the wafer W$_3$ and the wafer W$_2$. From time (4r−3)t$_1$ to (4r−2)t$_1$ for a time duration t$_1$, the reduction process is performed on the wafer W$_2$ in the processing station 114a, the gradient oxidation process is performed on the wafer W$_1$ in the processing station 114b, and the gradient etch process is performed on the wafer W$_4$ in the processing station 114c and the wafer W$_3$ in the processing station 114d, if the gradient etch process has been performed on the wafer W$_4$ and the wafer W$_3$. From time (4r−2)t$_1$ to (4r−1)t$_1$ for a time duration t$_1$, the reduction process is performed on the wafer W$_3$ in the processing station 114a, the gradient oxidation process is performed on the wafer W$_2$ in the processing station 114b, and the gradient etch process is performed on the wafer W$_1$ in the processing station 114c and the wafer W$_4$ in the processing station 114d. From time (4r−1)t$_1$ to 4rt$_1$ for a time duration t$_1$, the reduction process is performed on the wafer W$_4$ in the processing station 114a, the gradient oxidation process is performed on the wafer W$_3$ in the processing station 114b, the gradient etch process is performed on the wafer W$_2$ in the processing station 114c and the wafer W$_1$ in the processing station 114d. The reduction process and the gradient oxidation process are each performed for a time duration t$_1$, and the gradient etch process is performed for a time duration 2t$_1$ on each of the wafers W$_1$, W$_2$, W$_3$, and W$_4$ in each process cycle. The time duration t$_1$ is between about 10 seconds and about 90 seconds.

Figure 9:
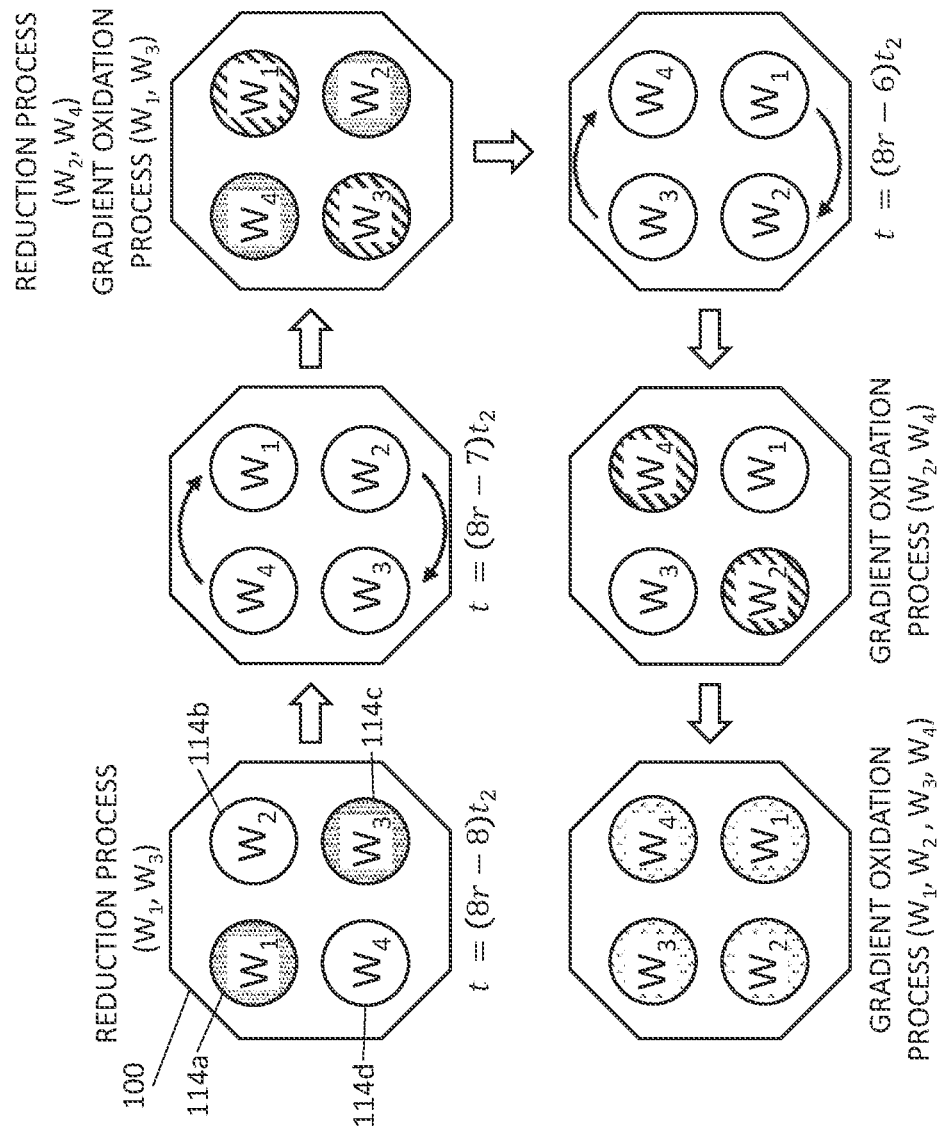
FIG. 9 illustrates another processing chamber configuration of a processing chamber with multiple processing stations, in accordance with one or more embodiment of the disclosure.

FIG. 9 illustrates another processing chamber configuration of a processing chamber with multiple processing stations, such as the processing chamber 100 having four processing stations 114, to perform process cycles of the reduction process in block 610, the gradient oxidation process in block 620, and the gradient etch process in block 630 of the method 600 in accordance with one or more embodiment of the disclosure. The four processing stations 114 aligned in the clockwise direction are labeled as 114a, 114b, 114c, and 114d. The processing stations 114a and 114c and configured to perform the reduction process in block 610 and the gradient etch process in block 630. The processing stations 114b and 114d are configured to perform the gradient oxidation process in block 620 and the gradient etch process in block 630.

A process cycle of the reduction process in block 610, the gradient oxidation process in block 620, and the gradient etch process in block 630 is repeated R times. The number of the repetition R is between 2 and 10.

As shown in FIG. 9, at time t=(8r−8)t$_2$, a wafer W$_1$ having a semiconductor structure 700 thereon is placed in the processing station 114a, a wafer W$_2$ having a semiconductor structure 700 thereon is placed in the processing station 114b, a wafer W$_3$ having a semiconductor structure 700 thereon is placed in the processing station 114c, and a wafer $W_4$ having a semiconductor structure 700 thereon is placed in the processing station 114d. For a time duration $t_2$ from $(8r-8)t_2$ to $(8r-7)t_2$, the reduction process is performed on the wafer $W_1$ in the processing station 114a and on the wafer $W_3$ in the processing station 114c. Subsequently, at time $t=(8r-7)t_2$, the wafer $W_1$ is transferred to the processing station 114b, the wafer $W_2$ is transferred to the processing station 114c, the wafer $W_3$ is transferred to the processing station 114d, and the wafer $W_4$ is transferred to the processing station 114a. For a time duration $t_2$ from $(8r-7)t_2$ to $(8r-6)t_2$ the reduction process is performed on the wafer $W_4$ in the processing station 114a and on the wafer $W_2$ in the processing station 114c, and the gradient oxidation process is performed on the wafer $W_1$ in the processing station 114b and on the wafer $W_3$ in the processing station 114d. Subsequently, at time $t=(8r-6)t_2$, the wafer $W_1$ is transferred to the processing station 114c, the wafer $W_2$ is transferred to the processing station 114d, the wafer $W_3$ is transferred to the processing station 114a, and the wafer $W_4$ is transferred to the processing station 114b. For a time duration $t_2$ from $(8r-6)t_2$ to $(8r-5)t_2$, the gradient oxidation process is performed on the wafer $W_4$ in the processing station 114b and on the wafer $W_2$ in the processing station 114d. Subsequently, a time duration $t_2$ from $(8r-5)t_2$ to $(8r-4)t_2$, the gradient etch process is performed on the wafer $W_1$ in the processing station 114c, the wafer $W_2$ in the processing station 114d, the wafer $W_3$ in the processing station 114a, and the wafer $W_4$ in the processing station 114b. These processes are repeated until the wafer $W_1$ is transferred back to the processing station 114a. The reduction process and the gradient oxidation process are each performed for a time duration $2t_2$, and the gradient etch process is performed for a time duration $2t_2$ on each of the wafers $W_1$, $W_2$, $W_3$, and $W_4$ in each process cycle. The time duration $t_2$ is between about 10 seconds and about 90 seconds.

Figure 10:
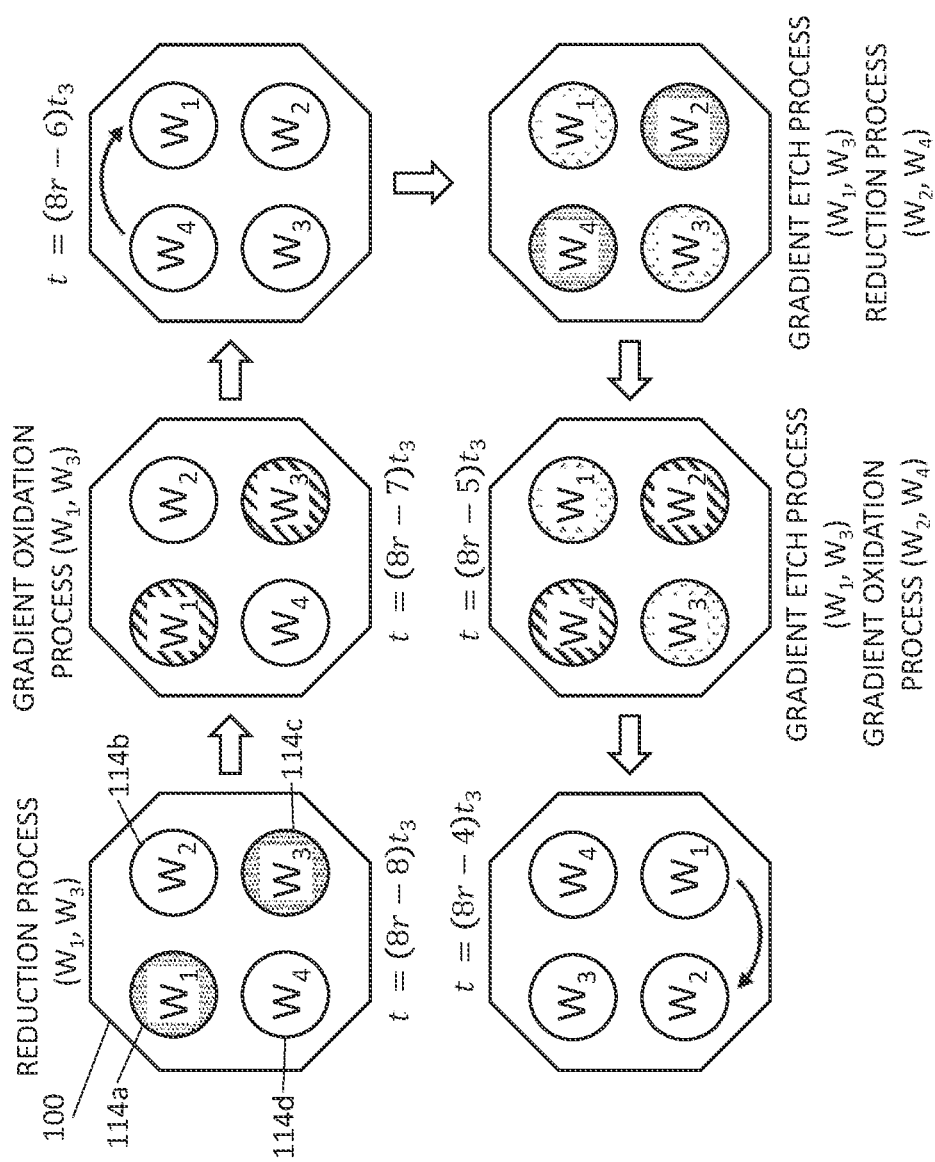
FIG. 10 illustrates another processing chamber configuration of a processing chamber with multiple processing stations, in accordance with one or more embodiment of the disclosure.

FIG. 10 illustrates yet another processing chamber configuration of a processing chamber with multiple processing stations, such as the processing chamber 100 having four processing stations 114, to perform process cycles of the reduction process in block 610, the gradient oxidation process in block 620, and the gradient etch process in block 630 of the method 600 in accordance with one or more embodiment of the disclosure. The four processing stations 114 aligned in the clockwise direction are labeled as 114a, 114b, 114c, and 114d. The processing stations 114a and 114c and configured to perform the reduction process in block 610 and the gradient oxidation process in block 620. The processing stations 114b and 114d are configured to perform the gradient etch process in block 630.

A process cycle of the reduction process in block 610, the gradient oxidation process in block 620, and the gradient etch process in block 630 is repeated R times. The number of the repetition R is between 2 and 10.

As shown in FIG. 10, at time $t=(8r-8)t_3$, a wafer $W_1$ having a semiconductor structure 700 thereon is placed in the processing station 114a, a wafer $W_2$ having a semiconductor structure 700 thereon is placed in the processing station 114b, a wafer $W_3$ having a semiconductor structure 700 thereon is placed in the processing station 114c, and a wafer $W_4$ having a semiconductor structure 700 thereon is placed in the processing station 114d. For a time duration $t_3$ from $(8r-8)t_3$ to $(8r-7)t_3$, the reduction process is performed on the wafer $W_1$ in the processing station 114a and on the wafer $W_3$ in the processing station 114c. For a time duration $t_3$ from $(8r-7)t_3$ to $(8r-6)t_3$, the gradient oxidation process is performed on the wafer $W_1$ in the processing station 114a and on the wafer $W_3$ in the processing station 114c. If the gradient process has been performed on the wafers $W_2$ and $W_4$, the gradient etch process is performed on the wafer $W_2$ in the processing station 114b and on the wafer $W_4$ in the processing station 114d for these time durations. Subsequently, at time $t=(8r-6)t_3$, the wafer $W_1$ is transferred to the processing station 114b, the wafer $W_2$ is transferred to the processing station 114c, the wafer $W_3$ is transferred to the processing station 114d, and the wafer $W_4$ is transferred to the processing station 114a. For a time duration $t_3$ from $(8r-6)t_3$ to $(8r-5)t_3$, the gradient etch process is performed on the wafer $W_1$ in the processing station 114b and on the wafer $W_3$ in the processing station 114d, and the reduction process is performed on the wafer $W_2$ in the processing station 114c and on the wafer $W_4$ in the processing station 114a. For a time duration $t_3$ from $(8r-5)t_3$ to $(8r-4)t_3$, the gradient etch process is performed on the wafer $W_1$ in the processing station 114b and on the wafer $W_3$ in the processing station 114d, and the reduction process is performed on the wafer $W_2$ in the processing station 114c and on the wafer $W_4$ in the processing station 114a. Subsequently, the wafer $W_1$ is transferred to the processing station 114c, the wafer $W_2$ is transferred to the processing station 114d, the wafer $W_3$ is transferred to the processing station 114a, and the wafer $W_4$ is transferred to the processing station 114b. These processes are repeated until the wafer $W_1$ is transferred back to the processing station 114a. The reduction process and the gradient oxidation process are each performed for a time duration $2t_3$, and the gradient etch process is performed for a time duration $4t_3$ on each of the wafers $W_1$, $W_2$, $W_3$, and $W_4$ in each process cycle. The time duration $t_3$ is between about 10 seconds and about 90 seconds.

In the embodiments described herein, methods and apparatuses for integrated processes of a reduction process, a gradient metal oxidation process, and a chemical metal oxide etch process within the same processing chamber having multiple process stations are provided. The reduction process uses a hydrogen ($H_2$) plasma to reset a metal surface, the gradient metal oxidation process uses an oxygen ($O_2$) plasma to partially oxidize the metal, and the chemical metal etch process selectively removes the oxidized metal. The processing chamber described herein enables multi-cycling capability with high wafer throughput benefits.

While the foregoing is directed to embodiments of the present disclosure, other and further embodiments of the disclosure may be devised without departing from the basic scope thereof, and the scope thereof is determined by the claims that follow.

What is claimed is:
1. A method of selective metal removal via gradient oxidation for a gap-fill, the method comprising:
  performing process cycles, each process cycle comprising:
   placing a first wafer having a first semiconductor structure thereon into a first processing station, the first semiconductor structure comprising a dielectric layer patterned with a feature formed therein and a seed layer formed on sidewalls and a bottom surface of the feature and a top surface of the dielectric layer;
   performing a reduction process on the first wafer in the first processing station, reducing oxides from the seed layer on the bottom surface of the feature;
   transferring the first wafer to a second processing station;
   performing a gradient oxidation process on the first wafer in the second processing station, partially oxidizing the seed layer in a field region over the top surface of the dielectric layer;
transferring the first wafer to a third processing station;
performing a gradient etch process on the first wafer in the third processing station, removing the oxidized seed layer;
transferring the first wafer to a fourth processing station; and
performing the gradient etch process on the first wafer in the fourth processing station,
wherein the first, second, third, and fourth processing stations are located in an interior volume of a processing chamber.

2. The method of claim 1, wherein the each process cycle further comprises:
when placing the first wafer in the first processing station, placing a second wafer having a second semiconductor structure thereon into the second processing station, a third wafer having a third semiconductor structure thereon into the third processing station, and a fourth wafer having a fourth semiconductor structure thereon into the fourth processing station, each of the second, third, and fourth semiconductor structures comprising a dielectric layer patterned with a feature formed therein and a seed layer formed on sidewalls and a bottom surface of the feature and a top surface of the dielectric layer;
when performing the reduction process on the first wafer in the first processing station, performing:
the gradient oxidation process on the second wafer in the second processing station, if the reduction process has been performed on the second wafer; and
the gradient etch process on the third wafer in the third processing station and on the fourth wafer in the fourth processing station, if the gradient oxidation process has been performed on the third and fourth wafers;
when transferring the first wafer to the second processing station, transferring the second wafer to the third processing station, the third wafer to the fourth processing station, and the fourth wafer to the first processing station;
when performing the gradient oxidation process on the first wafer in the second processing station, performing:
the reduction process on the fourth wafer in the first processing station; and
the gradient etch process on the second wafer in the third processing station and the third wafer in the fourth processing station, if the gradient oxidation process has been performed on the second and third wafers;
when transferring the first wafer to the third processing station, transferring the second wafer to the fourth processing station, the third wafer to the first processing station, and the fourth wafer to the second processing station;
when performing the gradient etch process on the first wafer in the third processing station, performing:
the reduction process on the third wafer in the first processing station;
the gradient oxidation process on the fourth wafer in the second processing station; and
the gradient etch process on the second wafer in the fourth processing station, if the gradient oxidation process has been performed on the second wafer;
when transferring the first wafer to the fourth processing station, transferring the second wafer to the first processing station, the third wafer to the second processing station, and the fourth wafer to the third processing station;
when performing the gradient etch process on the first wafer in the fourth processing station, performing:
the reduction process on the second wafer in the first processing station;
the gradient oxidation process on the third wafer in the second processing station; and
the gradient etch process on the fourth wafer in the third processing station.

3. The method of claim 1, wherein the reduction process comprises exposing the seed layer to a plasma formed from process gas including hydrogen ($H_2$)-containing gas.

4. The method of claim 3, wherein the reduction process is performed at a pressure between 2 m Torr and 120 mTorr and at a temperature of between 200° C. and 450° C. for a time duration of between 10 seconds and 90 seconds.

5. The method of claim 1, wherein the gradient oxidation process comprises exposing the seed layer to a plasma formed from a process gas including oxygen ($O_2$).

6. The method of claim 5, wherein the gradient oxidation process is performed at a pressure between 2 mTorr and 120 mTorr and at a temperature of between 200° C. and 450° C. for a time duration of between 10 seconds and 90 seconds.

7. The method of claim 1, wherein the gradient etch process comprises soaking the seed layer in a precursor including at least one of tungsten chloride ($WCl_5$, $WCl_6$), molybdenum fluoride ($MoF_6$), molybdenum chloride ($MoCl_5$, $MoCl_6$), tungsten fluoride ($WF_6$), tantalum chloride ($TaCl_5$), and tantalum fluoride ($TaF_5$).

8. The method of claim 7, wherein the gradient etch process is performed at a temperature of between 200° C. and 450° C. for a time duration of between 10 seconds and 90 seconds.

9. A method of selective metal removal via gradient oxidation for a gap-fill, the method comprising:
performing process cycles, each process cycle comprising:
placing a first wafer having a first semiconductor structure thereon into a first processing station, a second wafer having a second semiconductor structure thereon into a second processing station, a third wafer having a third semiconductor structure thereon into a third processing station, and a fourth wafer having a fourth semiconductor structure thereon into a fourth processing station, each of the first, second, third, and fourth semiconductor structures comprising a dielectric layer patterned with a feature formed therein and a seed layer formed on sidewalls and a bottom surface of the feature and a top surface of the dielectric layer;
performing a reduction process on the first wafer in the first processing station and on the third wafer in the third processing station, reducing oxides from the seed layer on the bottom surface of the feature;
performing a gradient oxidation process on the first wafer in the first processing station and on the third wafer in the third processing station, partially oxidizing the seed layer in a field region over the top surface of the dielectric layer;
transferring the first wafer into the second processing station, the second wafer into the third processing station, the third wafer into the fourth processing station, and the fourth wafer into the first processing station;

performing:
  a gradient etch process on the first wafer in the second processing station and on the third wafer in the fourth processing station, removing the oxidized seed layer; and
  the reduction process on the second wafer in the third processing station and on the fourth wafer in the first processing station; and
performing:
  the gradient etch process on the first wafer in the second processing station and on the third wafer in the fourth processing station; and
  the gradient oxidation process on the second wafer in the third processing station and on the fourth wafer in the first processing station,
wherein the first, second, third, and fourth processing stations are located in an interior volume of a processing chamber.

10. The method of claim 9, wherein the reduction process comprises exposing the seed layer to a plasma formed from process gas including hydrogen ($H_2$)-containing gas.

11. The method of claim 10, wherein the reduction process is performed at a pressure between 2 mTorr and 120 mTorr and at a temperature of between 200° C. and 450° C. for a time duration of between 10 seconds and 90 seconds.

12. The method of claim 9, wherein the gradient oxidation process comprises exposing the seed layer to a plasma formed from a process gas including oxygen ($O_2$).

13. The method of claim 12, wherein the gradient oxidation process is performed at a pressure between 2 mTorr and 120 mTorr and at a temperature of between 200° C. and 450° C. for a time duration of between 10 seconds and 90 seconds.

14. The method of claim 9, wherein the gradient etch process comprises soaking the seed layer in a precursor including at least one of tungsten chloride ($WCl_5$, $WCl_6$), molybdenum fluoride ($MoF_6$), molybdenum chloride ($MoCl_5$, $MoCl_6$), tungsten fluoride ($WF_6$), tantalum chloride ($TaCl_5$), and tantalum fluoride ($TaF_5$), at a temperature of between 200° C. and 450° C. for a time duration of between 10 seconds and 90 seconds.

15. A processing platform comprising:
  a processing chamber comprising a first processing station, a second processing station, a third processing station, a fourth processing station, located in an interior volume of the processing chamber; and
  a controller configured to cause the processing platform to perform process cycles, each process cycle comprising:
    placing a first wafer having a first semiconductor structure thereon into the first processing station, the first semiconductor structure comprising a dielectric layer patterned with a feature formed therein and a seed layer formed on sidewalls and a bottom surface of the feature and a top surface of the dielectric layer;
    performing a reduction process on the first wafer in the first processing station, reducing oxides from the seed layer on the bottom surface of the feature;
    transferring the first wafer to the second processing station;
    performing a gradient oxidation process on the first wafer in the second processing station, partially oxidizing the seed layer in a field region over the top surface of the dielectric layer;
    transferring the first wafer to the third processing station;
    performing a gradient etch process on the first wafer in the third processing station, removing the oxidized seed layer;
    transferring the first wafer to the fourth processing station; and
    performing the gradient etch process on the first wafer in the fourth processing station.

16. The processing platform of claim 15, wherein the each process cycle further comprises:
  when placing the first wafer in the first processing station, placing a second wafer having a second semiconductor structure thereon into the second processing station, a third wafer having a third semiconductor structure thereon into the third processing station, and a fourth wafer having a fourth semiconductor structure thereon into the fourth processing station, each of the second, third, and fourth semiconductor structures comprising a dielectric layer patterned with a feature formed therein and a seed layer formed on sidewalls and a bottom surface of the feature and a top surface of the dielectric layer;
  when performing the reduction process on the first wafer in the first processing station, performing:
    the gradient oxidation process on the second wafer in the second processing station, if the reduction process has been performed on the second wafer; and
    the gradient etch process on the third wafer in the third processing station and on the fourth wafer in the fourth processing station, if the gradient oxidation process has been performed on the third and fourth wafers;
  when transferring the first wafer to the second processing station, transferring the second wafer to the third processing station, the third wafer to the fourth processing station, and the fourth wafer to the first processing station;
  when performing the gradient oxidation process on the first wafer in the second processing station, performing:
    the reduction process on the fourth wafer in the first processing station; and
    the gradient etch process on the second wafer in the third processing station and the third wafer in the fourth processing station, if the gradient oxidation process has been performed on the second and third wafers;
  when transferring the first wafer to the third processing station, transferring the second wafer to the fourth processing station, the third wafer to the first processing station, and the fourth wafer to the second processing station;
  when performing the gradient etch process on the first wafer in the third processing station, performing:
    the reduction process on the third wafer in the first processing station;
    the gradient oxidation process on the fourth wafer in the second processing station; and
    the gradient etch process on the second wafer in the fourth processing station, if the gradient oxidation process has been performed on the second wafer;
  when transferring the first wafer to the fourth processing station, transferring the second wafer to the first processing station, the third wafer to the second processing station, and the fourth wafer to the third processing station;
  when performing the gradient etch process on the first wafer in the fourth processing station, performing:

the reduction process on the second wafer in the first processing station;

the gradient oxidation process on the third wafer in the second processing station; and the gradient etch process on the fourth wafer in the third processing station.

17. The processing platform of claim 15, wherein the reduction process comprises exposing the seed layer to a plasma formed from process gas including hydrogen ($H_2$)-containing gas.

18. The processing platform of claim 17, wherein the reduction process is performed at a pressure between 2 mTorr and 120 mTorr and at a temperature of between 200° C. and 450° C. for a time duration of between 10 seconds and 90 seconds.

19. The processing platform of claim 15, wherein the gradient oxidation process comprises exposing the seed layer to a plasma formed from a process gas including oxygen ($O_2$) at a pressure between 2 mTorr and 120 mTorr and at a temperature of between 200° C. and 450° C. for a time duration of between 10 seconds and 90 seconds.

20. The processing platform of claim 15, wherein the gradient etch process comprises soaking the seed layer in a precursor including at least one of tungsten chloride ($WCl_5$, $WCl_6$), molybdenum fluoride ($MoF_6$), molybdenum chloride ($MoCl_5$, $MoCl_6$), tungsten fluoride ($WF_6$), tantalum chloride ($TaCl_5$), and tantalum fluoride ($TaF_5$) at a temperature of between 200° C. and 450° C. for a time duration of between 10 seconds and 90 seconds.

\* \* \* \* \*